(12) United States Patent
Silver et al.

(10) Patent No.: US 7,772,710 B2
(45) Date of Patent: Aug. 10, 2010

(54) ZERO-ORDER OVERLAY TARGETS

(75) Inventors: Richard Silver, Derwood, MD (US);
Pete Lipscomb, Cedar Park, TX (US);
Bryan Barnes, Derwood, MD (US);
Ravikirran Attota, Germantown, MD (US)

(73) Assignees: Sematech, Inc., Austin, TX (US);
National Institute of Standards and Technology, Gaithersburg, MD (US)

( * ) Notice: Subject to any disclaimer, the term of this patent is extended or adjusted under 35 U.S.C. 154(b) by 242 days.

(21) Appl. No.: 11/931,140

(22) Filed: Oct. 31, 2007

(65) Prior Publication Data

US 2008/0142998 A1 Jun. 19, 2008

Related U.S. Application Data

(60) Provisional application No. 60/855,957, filed on Nov. 1, 2006.

(51) Int. Cl.
*H01L 23/544* (2006.01)
(52) U.S. Cl. ............. 257/797; 257/283; 257/E21.54; 257/E23.179; 438/401; 438/462; 356/401; 356/400
(58) Field of Classification Search ............ 257/797, 257/283, E21.54, E23.179; 438/401, 462; 356/401, 400
See application file for complete search history.

(56) References Cited

U.S. PATENT DOCUMENTS

| 4,200,395 | A | 4/1980 | Smith et al. | 356/356 |
|---|---|---|---|---|
| 4,332,473 | A | 6/1982 | Ono | 356/356 |
| 5,963,329 | A | 10/1999 | Conrad et al. | 356/372 |
| 6,023,338 | A | 2/2000 | Bareket | 356/401 |
| 6,077,756 | A | 6/2000 | Lin et al. | 438/401 |
| 6,079,256 | A | 6/2000 | Bareket | 73/105 |
| 6,150,231 | A | 11/2000 | Muller et al. | 438/401 |
| 6,157,451 | A * | 12/2000 | Mizuno | 356/394 |
| 6,767,680 | B2 | 7/2004 | Schulz | 430/30 |
| 6,819,426 | B2 | 11/2004 | Sezginer et al. | 356/401 |
| 6,914,017 | B1 | 7/2005 | Baluswamy et al. | 438/975 |
| 6,947,141 | B2 | 9/2005 | Bischoff et al. | 356/369 |
| 7,193,715 | B2 | 3/2007 | Smedt et al. | 356/401 |
| 7,229,566 | B2 * | 6/2007 | Matsumoto et al. | 216/60 |
| 7,230,703 | B2 | 6/2007 | Sezginer et al. | 356/401 |
| 7,230,704 | B2 | 6/2007 | Sezginer et al. | 356/401 |
| 2005/0208685 | A1 * | 9/2005 | Abdulhalim et al. | 438/14 |
| 2006/0065625 | A1 | 3/2006 | Abdulhalim et al. | 216/59 |
| 2006/0197951 | A1 | 9/2006 | Frommer et al. | 356/401 |

* cited by examiner

*Primary Examiner*—Tu-Tu V Ho
(74) *Attorney, Agent, or Firm*—Fulbright & Jaworski

(57) ABSTRACT

A zero-order overlay target comprises a first zero-order line array fabricated on a first layer of a semiconductor structure, the first zero-order line array having a first pitch, and a second zero-order line array fabricated on a second layer of the semiconductor structure, the second zero-order line array having a second pitch. The second pitch may be different from the first pitch, and a portion of the second zero-order line array may be positioned to become optically coupled to a portion of the first zero-order line array when subject to an overlay measurement. Further, the second pitch may be variable. For example, the variable pitch may comprise a first set of features having a pitch approximately equal to the first pitch, a second set of features having a pitch different from the first pitch, and a third set of features having a pitch approximately equal to the first pitch.

19 Claims, 7 Drawing Sheets

ZERO-ORDER OVERLAY TARGETS

This application claims priority to U.S. Provisional Application Ser. No. 60/855,957filed Nov. 1, 2006, the contents of which are incorporated herein by reference in their entirety.

BACKGROUND OF THE INVENTION

1. Field of the Invention

The present invention relates generally to semiconductor manufacturing and, more particularly, to zero-order overlay targets.

2. Description of Related Art

Semiconductor manufacturing generally involves the formation of several layers of different materials on top of each other. For example, features such as transistor gates and interconnects are created within separate layers of the same integrated circuit, and thus require distinct lithography steps. Typically, the alignment tolerance of these layers is less than the width of a single gate.

The term "overlay" generally refers to the displacement of a layer from its ideal position with respect to a lower layer. In most instances, the overlay may be represented by a two dimensional vector in the plane of the semiconductor wafer. The goal of overlay metrology is to determine and correct overlay errors, thus providing structures that have approximately perfect overlay or alignment.

BRIEF SUMMARY OF THE INVENTION

The present invention provides zero-order overlay targets. In one embodiment, an overlay target comprises a first zero-order line array fabricated on a first layer of a semiconductor structure, the first zero-order line array having a first pitch, and a second zero-order line array fabricated on a second layer of the semiconductor structure, the second zero-order line array having a second pitch. The second pitch may be different from the first pitch, and a portion of the second zero-order line array may be positioned to become optically coupled to a portion of the first zero-order line array when subject to an overlay measurement procedure. Further, the second pitch may be variable. For example, the variable pitch may comprise a first set of features having a pitch approximately equal to the first pitch, a second set of features having a pitch different from the first pitch, and a third set of features having a pitch approximately equal to the first pitch, the second set of features being positioned between the first and third sets of features. The first and second layer may be adjacent to each other, or may have an intermediate layer therebetween.

In another embodiment, a method comprises providing a semiconductor substrate, etching a first zero-order line array on the semiconductor substrate, the first zero-order line array having a first pitch, depositing a polycrystalline silicon layer over the first zero-order line array portion of the semiconductor substrate, depositing a resist over the polycrystalline silicon layer, and imaging a second zero-order line array upon the resist, the second zero-order line array having a second pitch. In yet another embodiment, a method comprises providing a semiconductor substrate, creating an overlay target on the semiconductor substrate, the target comprising: a first zero-order line array fabricated on a first layer of a semiconductor structure, the first zero-order line array having a first pitch, and a second zero-order line array fabricated on a second layer of the semiconductor structure, the second zero-order line array having a second pitch. The method may further comprise imaging the overlay target to determine an offset, and then correcting the offset.

The term "coupled" is defined as optically connected, although not necessarily directly. The terms "a" and "an" are defined as one or more unless this disclosure explicitly requires otherwise. The terms "substantially," "approximately," "about," and variations thereof are defined as being largely but not necessarily wholly what is specified, as understood by a person of ordinary skill in the art. In one non-limiting embodiment, the term substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but it may also be configured in ways other than those specifically described.

BRIEF DESCRIPTION OF THE SEVERAL VIEWS OF THE DRAWINGS

For a more complete understanding of the present invention, reference is now made to the following drawings, in which.

DETAILED DESCRIPTION OF THE INVENTION

In the following detailed description, reference is made to the accompanying drawings that illustrate embodiments of the present invention. These embodiments are described in sufficient detail to enable a person of ordinary skill in the art to practice the invention without undue experimentation. It should be understood, however, that the embodiments and examples described herein are given by way of example only, and not by way of limitation. Various substitutions, modifications, additions, and rearrangements may be made without departing from the spirit of the present invention. Therefore, the description that follows is not to be taken in a limited sense, and the scope of the present invention is defined only by the appended claims.

Figure 1:
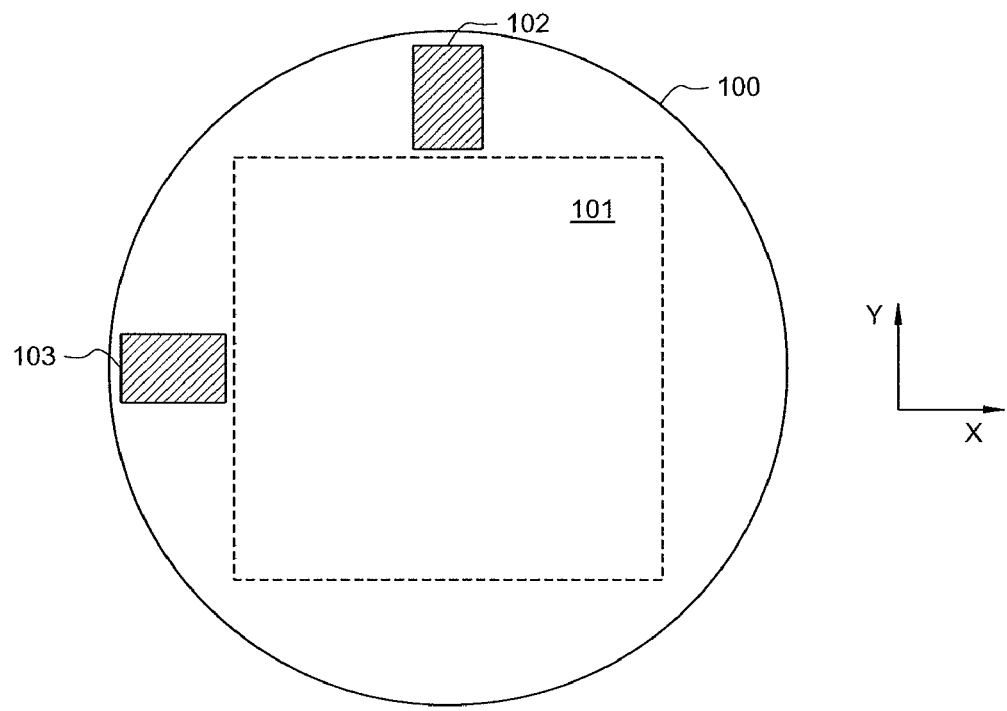
FIG. 1 is a top view of a semiconductor wafer according to an illustrative embodiment of the present invention.

Turning to FIG. 1, a top view of a semiconductor wafer is depicted according to one embodiment of the present invention. Wafer 100 comprises device or production area 101, upon which semiconductor devices may be fabricated. In addition, wafer 100 comprises one or more overlay targets areas 102 and 103 (not drawn to scale). In this illustrative example, overlay target area 102 may comprise features that allow an overlay error or offset to be measured in the y axis, whereas target area 103 may contain features for measuring an offset in the x axis. In alternative embodiments, target areas 102 and 103 may be replaced by a single target area that allows both y and x axis measurements. Also, wafer 100 may also comprise a plurality of die within production area 101, each die having its own set of overlay targets. In some embodiments, overlay targets may be placed throughout the die, in die, or in scribe.

Figure 2:
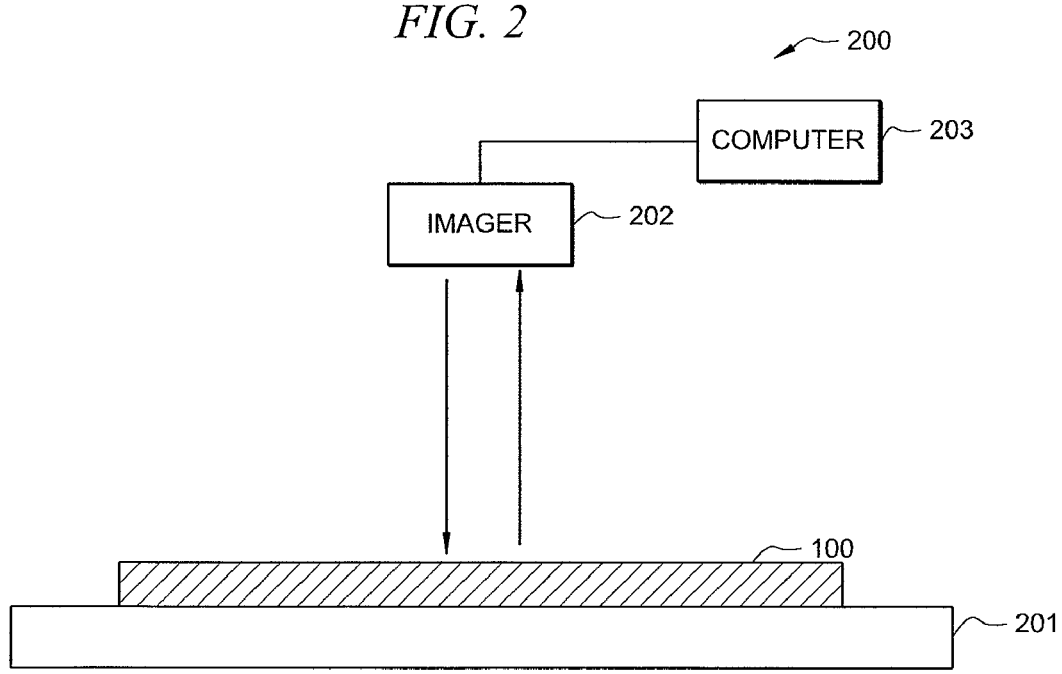
FIG. 2 is a block a diagram of an overlay metrology system according to an illustrative embodiment of the present invention.

FIG. 2 shows overlay metrology system 200 according to one embodiment of the present invention. Wafer 100 rests on top of stage 201. Imager 202 is configured to obtain an optical image of at least a portion of wafer 100. Meanwhile, computer 203 controls and/or receives the optical image from imager 202. Overlay metrology system 200 is typically implemented within the chamber of a semiconductor processing tool such as, for example, a lithography tool. In some embodiments, imager 202 may be a microscope, scatterometer, or the like.

Figure 3A:
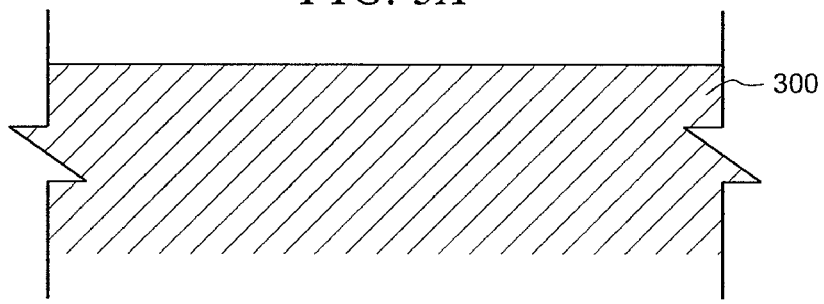
FIGS. 3A-D are cross-section views of a semiconductor structure illustrating fabrication steps of a zero-order overlay target according to an illustrative embodiment of the present invention.
Figure 3B:
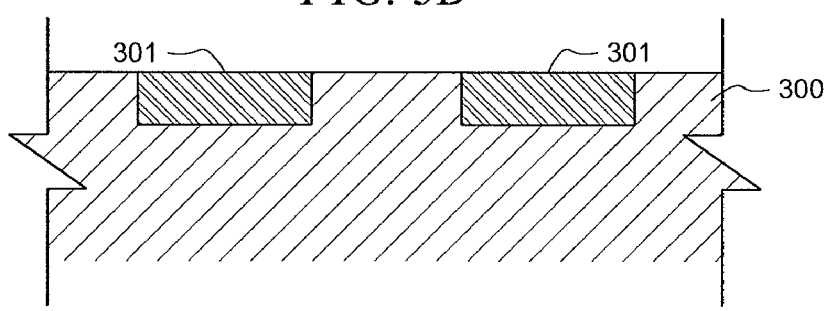
Figure 3C:
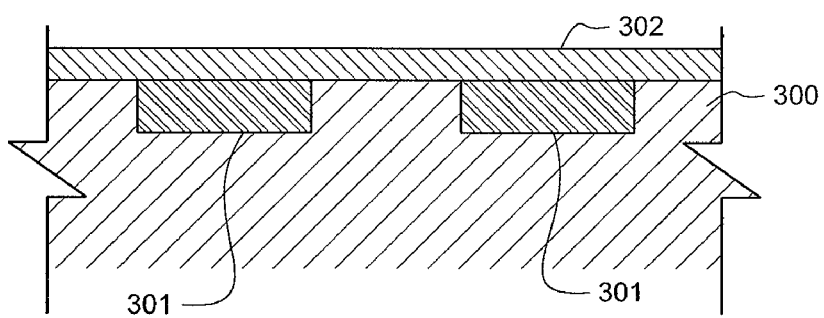
Figure 3D:
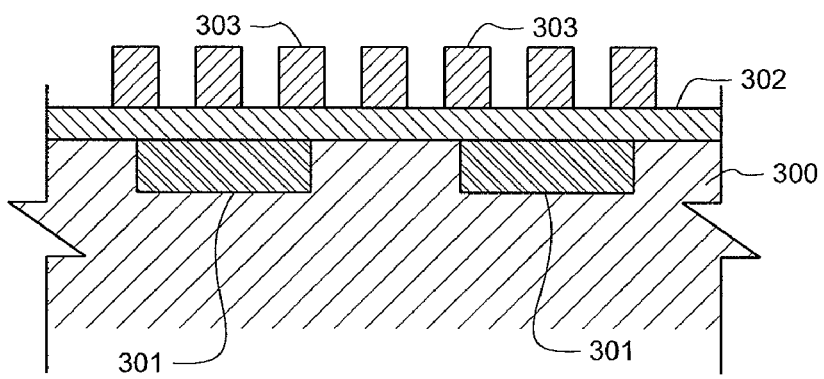

With respect to FIGS. 3A-D, cross-section views of a semiconductor structure are provided to illustrate steps involved in the fabrication of a zero-order overlay target, according to one embodiment of the present invention. In an initial step shown in FIG. 3A, semiconductor substrate 300 is provided. Substrate 300 may be, for example, within target areas 102 and/or 103 of wafer 100 shown in FIG. 1. Then, two or more "trenches" 301 are etched from substrate 300, as shown in FIG. 3B. For example, trenches 301 may be filled with a deposit of oxide or the like. FIG. 3C depicts polycrystalline silicon layer 302 deposited over substrate 300 and trenches 301. Lastly, as shown in FIG. 3D, resist 303 may be deposited and patterned over polycrystalline silicon layer 302, thus forming a plurality of "bars" thereon. As a person of ordinary skill in the art will readily recognized in light of this disclosure, FIGS. 3A-D are provided for illustration purposes only, and several variations in the aforementioned steps and/or materials are allowed in the fabrication of zero-order overlay targets according to the present invention.

The resulting zero-order overlay target may comprise two sets of zero-order line arrays, each line array within a different layer of the semiconductor structure. For instance, a first zero-order line array (e.g., as defined by oxide-filled trenches 301 in FIGS. 3B-D) may be fabricated on a first layer of the semiconductor structure, while a second zero-order line array (e.g., as defined by resist bars 303) may be fabricated on a second layer of the semiconductor structure. The term "zero-order line array" refers to a line array that has a pitch (i.e., the distance between the center of two adjacent trenches, bars, or other features) that may be approximately equal to one half (½) of the wavelength of the imager used in making overlay measurements (e.g., imager 202 of FIG. 2). There may be a large range for zero-order structures relative to the measurement wavelength. Each zero-order line array, when imaged individually, yields a zero order optical reflection and therefore is generally invisible to the imager. When two sets of zero-order line arrays are optically coupled, however, they create a "superstructure" that reflects a higher order optical signal if one zero-order line array has a pitch that is different from the pitch of the other zero-order line.

Figure 4:
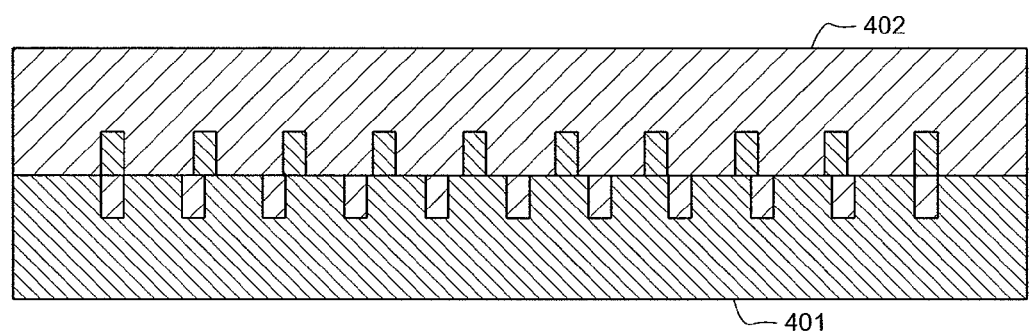
FIG. 4 is a cross-section view of a zero-order overlay target according to an illustrative embodiment of the present invention.

The zero-order overlay target design shown in FIG. 4 comprises a first set of zero-order line arrays at layer 401 and a second set of zero-order line arrays at layer 402. These zero-order line arrays may be repeated a number of times (or periods) to form a longer array, and the bars or trenches making up each zero-order line array may be segmented or continuous. Further, two such patterns may be place at right angles to one another forming a "T" shape or an "L" shape to provide both x and y offset information. They may be used independently or combined, thus requiring either one or two actual image acquisitions for each axis. Alternatively, a series of vias, contacts, or two-dimensional structures may be placed over one another forming a fully two-dimensional implementation. One implementation may use an array of posts or contact holes allowing simultaneous measurement from the combined interference results of the differing two-level pitch of the two-dimensional features.

EXAMPLE NO. 1

In one illustrative target design using the arrangement generally described in FIG. 4, the pitch of the second zero-order line array (within layer 402) is 200 nm, and the pitch of the first zero-order line array (within layer 401) is 190 nm. The width of the trenches and bars within layers 401 and 402, respectively, may be approximately 50 nm. Further, the depth of the trenches and height of the bars is about 100 nm. If the lines are 5 microns in length, the resulting target is approximately 5×12 microns in size. However, the size of the target that can be used may depend upon specific application requirements. In this example, the first and second zero-order line arrays, when imaged separately, are substantially invisible to a wavelength of about 546 nm.

Figure 5A:
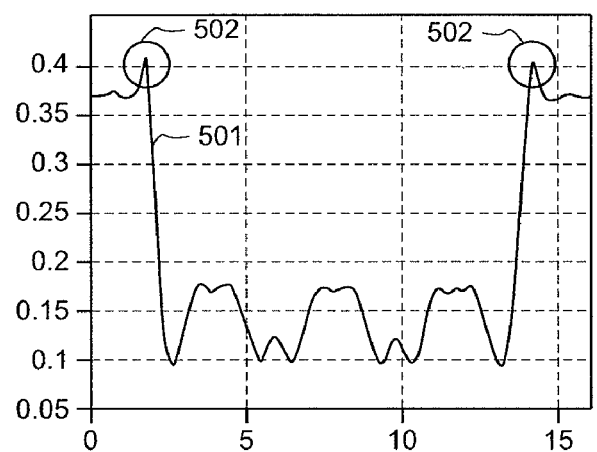
FIGS. 5A-C are graphs illustrating simulated overlay measurements according to an illustrative embodiment of the present invention.
Figure 5B:
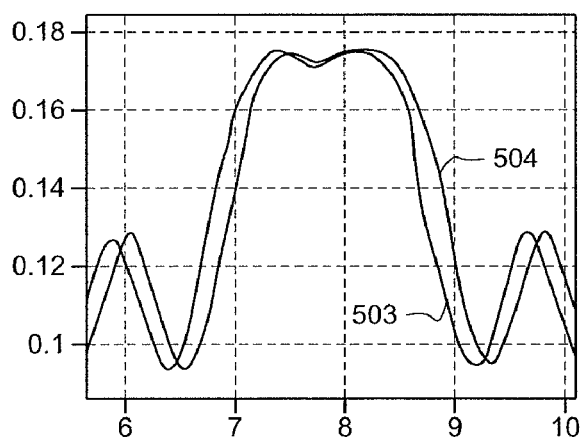

FIG. 5A shows a simulated graph of the target pattern of this example having 60 bars in the second zero-order line array and 60 trenches in the first zero-order line. The x-axis shows distance and the y axis represents intensity. The resulting scattered electromagnetic field has higher order content resulting from the combined physical structure, which now reflects the higher order content. Curve 501 includes "fiducials" 502 (due to the extremities or outer edges of the target) that do not generally move in the x-direction in the presence of offsets. FIG. 5B zooms into the mid-20 features located around the center of curve 501, and shows two different offsets 503 and 504 for different simulations.

The lateral shift or horizontal distance between curves 503 and 504 is due to the overlay offset and relative pitch ratio or magnification factor. One method for determining the overlay offset comprises using an image folding technique. This method determines an asymmetry in the center portion of curve 501 between fiducials 502 and attributes that asymmetry to the offset (if curve 501 is symmetric, there is a perfect overlay), while taking into account a magnification factor. Other offset measurement methods may also be used, such as, for example, reversion methods, signal peak approximations, or the like.

Figure 5C:
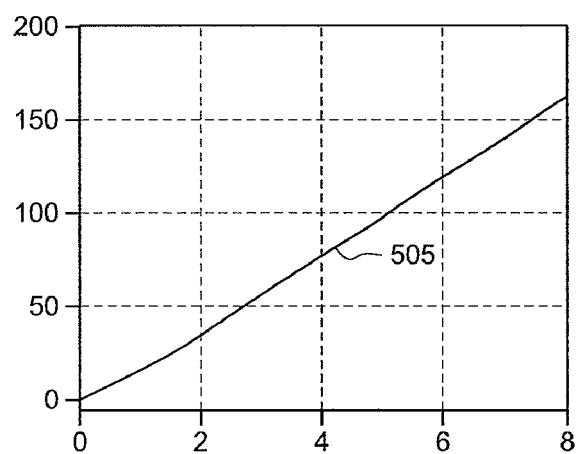

The magnification factor may be further understood with respect to FIG. 5C, where the x axis shows actual overlay shift (on the semiconductor structure) and the y axis shows the overlay shift measured using graphs 503 and 504. In this example, the magnification factor is shown in curve 505 to be about 40 times—i.e., a real overlay offset of about 2 nm is perceived as an asymmetry in curve 501 of about 40 nm.

EXAMPLE NO. 2

In another illustrative target design using the arrangement shown in FIG. 4, the pitch of the second zero-order line array (within layer 402) is 200 nm and the pitch of the first zero-order line array (within layer 401) is 150 nm. The width, depth, and height of the trenches and bars within layers 401 and 402 are identical. Again, the first and second zero-order line sets, when imaged separately, are substantially invisible to a wavelength of about 546 nm or only reflect specular content.

Figure 6A:
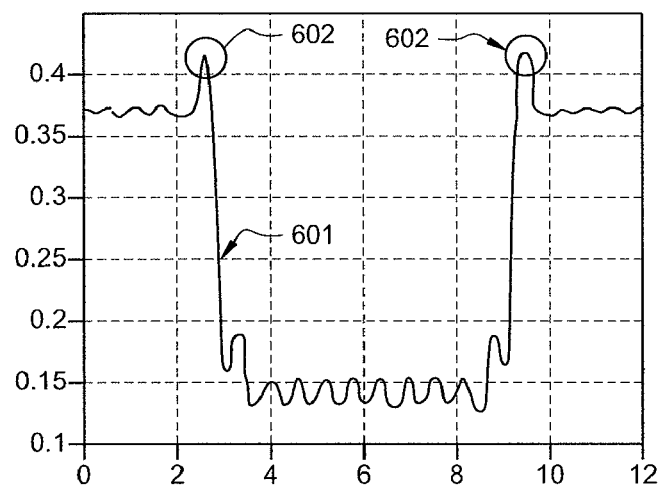
FIGS. 6A-C are graphs illustrating additional simulated overlay measurements according to an illustrative embodiment of the present invention.
Figure 6B:
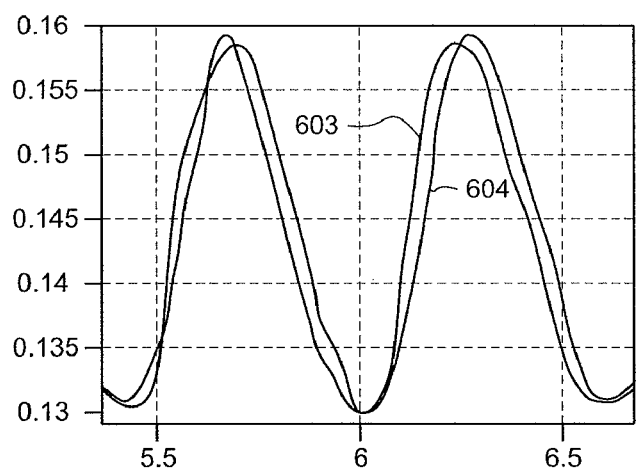
Figure 6C:
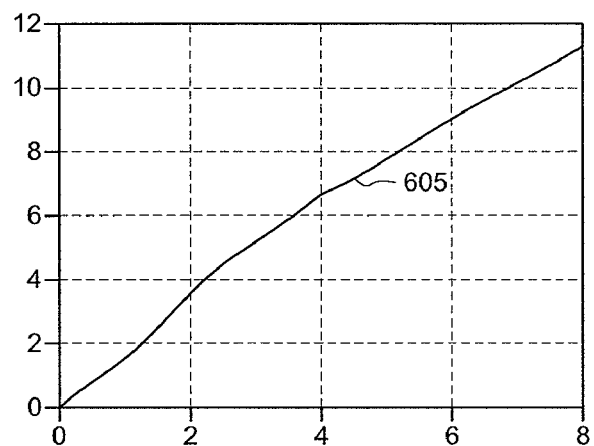

FIG. 6A is a simulated graph of a target pattern (similar to the one of FIG. 5A) showing curve 601 and fiducials 602. FIG. 6B shows a zoom in the central 20 features of curve 601 revealing two different offsets 603 and 604 for different simulations. The magnification factor of this arrangement is shown by curve 605 to be of about 2 times—i.e., a real overlay offset of about 2 nm is perceived as a shift in the curve (603 versus 604) of about 4 nm. However, it should be noted that curve 605 is more non-linear than curve 505 of FIG. 5C.

EXAMPLE NO. 3

Figure 7:
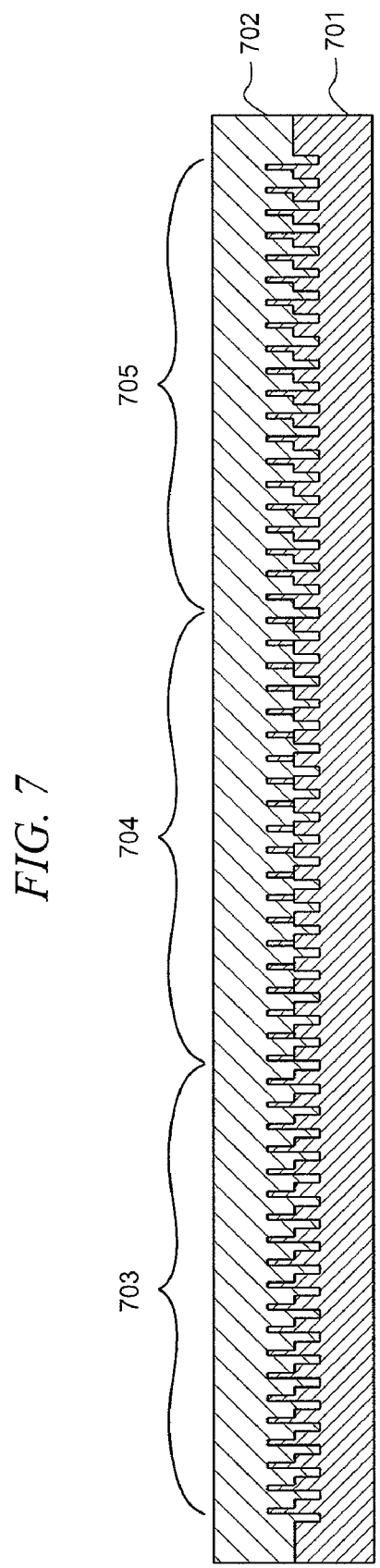
FIG. 7 is a cross-section view of another zero-order overlay target according to an illustrative embodiment of the present invention.

In certain embodiments of the present invention, at least one of the lines fabricated in the overlay target may have a variable pitch. For example, with respect to FIG. 7, the zero-order line array in layer 701 may have a first pitch. A first portion 703 of the zero-order line array of layer 702 may have a first pitch approximately equal to the pitch of a third portion 705. A second portion 704 of the zero-order line array of layer 702 may have a second pitch that is different from the first pitch. This results in a target that has a constant, zero-order response, except for the central region where the first and second lines have a different pitch. This may be particularly useful to eliminate direct overlay of different level features when overlaid manufacturing presents a real challenge. That is, the same lower frequency, higher order optical effect may be used without completing a full phase revolution.

Figure 8A:
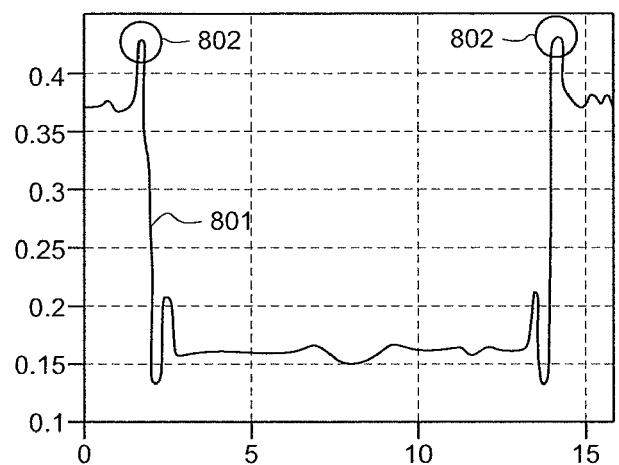
FIGS. 8A-C are graphs illustrating simulated overlay measurements according to another illustrative embodiment of the present invention.
Figure 8B:
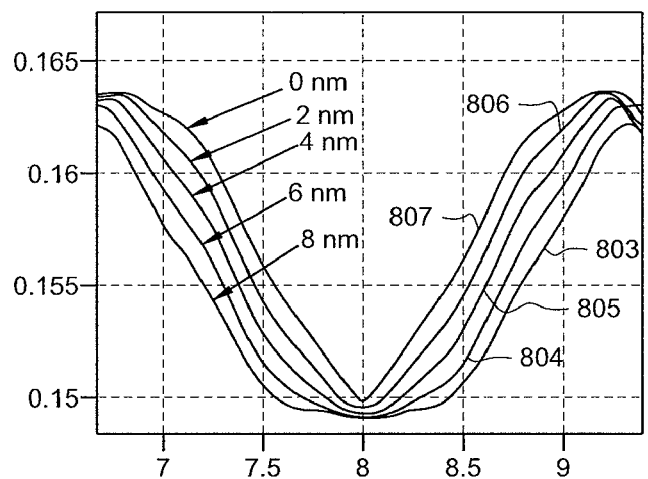
Figure 8C:
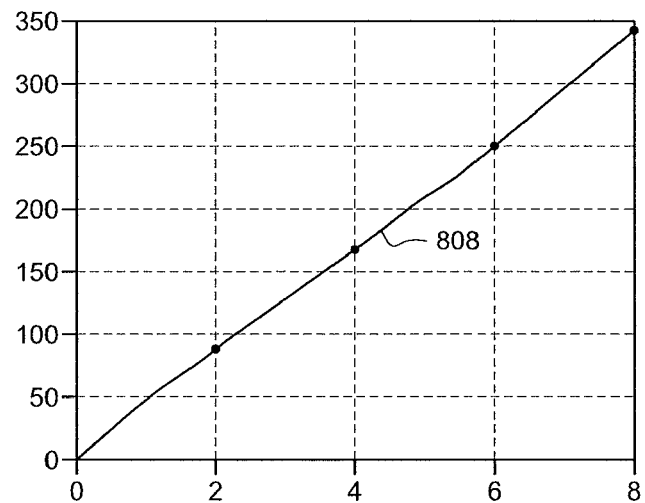

FIG. 8A is a simulated graph of a target pattern discussed in this example showing curve 801 and fiducials 802. FIG. 8B shows a zoom in the central 20 features of curve 801 showing five different offsets 803-807 for different simulations. The magnification factor of this arrangement is shown by curve 808 to be of about 40 times—i.e., a real overlay offset of about 2 nm is perceived as an asymmetry in curve 801 of about 80 nm. It should be noted that curve 801 exhibits better fiducial behavior than curves 501 or 601 depicted in FIGS. 5A and 6A, respectively.

As a person of ordinary skill in the art will readily recognize in light of this disclosure, the present invention provides numerous advantages over conventional overlay metrology systems and methods. For example, certain embodiments of the present invention allow optical overlay measurements to be performed using device-sized dimensions and very dense targets and conventional imaging techniques. In addition, overlay targets of the present invention enable a magnification of the actual overlay offset by factors of 10 or 20, for example, based on the relative values of the to be described pitch. As a result, a 2 nm actual overlay offset can yield a 20 nm or 40 nm offset in the reflected signal. The techniques described herein have no limitation on feature size and feature density.

The concept of the fiducial lines is important. Different fiducial lines may allow the upper or lower structure to extend laterally beyond the other structure a distance to allow no interaction or nonlinearity of the fiducials. Further, fiducials are not amplified with the magnification factor and as such are less sensitive to errors. On the other hand, the design of alternative fiducials may improve measurement performance and accuracy.

Additional applications of the present invention may involve alignment systems. In a lithographic stepper, for example, arrays are used for aligning the current lithographic exposure level to an existing level. In one embodiment, an alignment array is brought into optical proximity to another single zero-order array, each array having a different pitch pattern. Alternatively, an alignment array and a reference array may be brought to optical proximity through propagation in an optical medium. The measured array and the reference array must act as a superstructure to yield the effects described herein together, and the lateral shift of the higher order optical content may be monitored. This effect may be based upon having two different pitches in the zero-order dense range, with pitch differences designed to yield higher order reflected optical effects.

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the processes, machines, manufactures, means, methods, and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufactures, means, methods, or steps.

The invention claimed is:

1. An overlay target comprising:
    a first zero-order line array fabricated on a first layer of a semiconductor structure, the first zero-order line array having a first pitch; and
    a second zero-order line array fabricated on a second layer of the semiconductor structure, the second zero-order line array having a second pitch, where the first pitch and the second pitch are configured to produce fiducials.

2. The overlay target of claim 1, a portion of the second zero-order line array being positioned to become optically coupled to a portion of the first zero-order line array when subject to an overlay measurement procedure.

3. The overlay target of claim 1, where the second pitch is longer, but not more than 50% longer, than the first pitch.

4. The overlay target of claim 1, the second pitch comprising a variable pitch.

5. The overlay target of claim 4, the variable pitch comprising:
    a first region of the second zero-order line array;
    a second region of the second zero-order line array having a pitch different from the first region; and
    a third region of the second zero-order line array having a pitch approximately equal to the first region, the second region being positioned between the first region and the third region.

6. The overlay target of claim 1, the first and second layer being adjacent to each other.

7. The overlay target of claim 1, the first layer comprising a silicon substrate.

8. The overlay target of claim 7, the second layer comprising a resist layer.

9. The overlay target of claim 1, further comprising an intermediate layer between the first and second layers.

10. The overlay target of claim 9, the intermediate layer comprising a polycrystalline silicon layer.

11. A method comprising:
    providing a semiconductor substrate;
    etching a first zero-order line array on the semiconductor substrate, the first zero-order line array having a first pitch;
    depositing a polycrystalline silicon layer over the first zero-order line array portion of the semiconductor substrate;
    depositing a resist over the polycrystalline silicon layer; and
    imaging a second zero-order line array upon the resist, the second zero-order line array having a second pitch, where the first pitch and the second pitch are configured to produce fiducials.

12. The method of claim 11, a portion of the second zero-order line array being positioned to become optically coupled to a portion of the first zero-order line array when subject to an overlay measurement procedure.

13. The method of claim 11, the second pitch comprising a variable pitch.

14. The method of claim 13, the variable pitch comprising:
    a first region of the second zero-order line array;
    a second region of the second zero-order line array having a pitch different from the first region; and
    a third region of the second zero-order line array having a pitch approximately equal to the first region, the second region being positioned between the first region and the third region.

15. A method comprising:
    providing a semiconductor substrate;
    creating an overlay target on the semiconductor substrate, the target comprising:
        a first zero-order line array fabricated on a first layer of a semiconductor structure, the first zero-order line array having a first pitch; and
        a second zero-order line array fabricated on a second layer of the semiconductor structure, the second zero-order line array having a second pitch, where the first pitch and the second pitch are configured to produce fiducials;
    imaging the overlay target to determine an offset; and
    correcting the offset.

16. The method claim 15, a portion of the second zero-order line array being positioned to become optically coupled to a portion of the first zero-order line array during the imaging step.

17. The method of claim 15, where determining the offset comprises performing image folding with respect to at least one intermediate point between a pair of fiducials.

18. The method of claim 15, where determining the offset comprising accounting for a magnification factor.

19. The method of claim 15, where correcting the offset comprises re-positioning a semiconductor manufacturing tool to compensate for the offset.

* * * * *